(12) United States Patent
Morisada (10) Patent No.: US 6,680,756 B1
(45) Date of Patent: Jan. 20, 2004

(54) RECEIVER HAVING A PRESET TUNER

(75) Inventor: Katsuhiro Morisada, Osaka (JP)

(73) Assignee: Funai Electric Co., Ltd, Osaka (JP)

( * ) Notice: Subject to any disclaimer, the term of this patent is extended or adjusted under 35 U.S.C. 154(b) by 0 days.

(21) Appl. No.: 09/468,187

(22) Filed: Dec. 21, 1999

(30) Foreign Application Priority Data

Dec. 24, 1998 (JP) .......................................... 10-010225

(51) Int. Cl.$^7$ ................................................ H04N 5/50
(52) U.S. Cl. ........................ 348/732; 348/731; 725/151; 725/38; 725/59
(58) Field of Search .............................. 725/38, 56, 59, 725/100, 131, 139, 151; 455/168.1, 176.1, 180.2, 188.2, 185.1–186.2, 180.1, 188.1; 348/731, 732

(56) References Cited

U.S. PATENT DOCUMENTS

| | | | | | |
|---|---|---|---|---|---|
| 4,776,038 A | * | 10/1988 | Testin et al. | ................. | 455/182 |
| 5,479,214 A | * | 12/1995 | Sakakibara et al. | ......... | 348/558 |
| 6,344,882 B1 | * | 2/2002 | Shim et al. | ................. | 348/731 |
| 6,400,422 B1 | * | 6/2002 | Nakamura | ................... | 348/732 |

FOREIGN PATENT DOCUMENTS

| JP | 05247296 | 9/1993 |
|---|---|---|
| JP | 07087415 | 3/1995 |

* cited by examiner

Primary Examiner—Andrew Faile
Assistant Examiner—Matthew Demicco
(74) Attorney, Agent, or Firm—Myron Greenspan, Esq.; Lackenbach Siegel, LLP (57) ABSTRACT

A receiver includes a CPU. The CPU can determine whether a variable N has reached a predetermined value X or not. The variable N is the number of channels over which broadcast signals could have been consecutively received. If "YES" is determined in the determination, the CPU performs presetting according to a CATV broadcast channel plan.

3 Claims, 14 Drawing Sheets

| CHANNEL | TV (MHz) | CATV (MHz) |
|---|---|---|
| 1 | — | 73.25 |
| 2 | 55.25 | 55.25 |
| 3 | 61.25 | 61.25 |
| 4 | 67.25 | 67.25 |
| 5 | 77.25 | 77.25 |
| 6 | 83.25 | 83.25 |
| 7 | 175.25 | 175.25 |
| 8 | 181.25 | 181.25 |
| 9 | 187.25 | 187.25 |
| 10 | 193.25 | 193.25 |
| 11 | 199.25 | 199.25 |
| 12 | 205.25 | 205.25 |
| 13 | 211.25 | 211.25 |
| 14 | 471.25 | 121.25 |
| 15 | 477.25 | 127.25 |
| 16 | 483.25 | 133.25 |
| 17 | 489.25 | 139.25 |
| 18 | 495.25 | 145.25 |
| 19 | 501.25 | 151.25 |
| 20 | 507.25 | 157.25 |
| 21 | 513.25 | 163.25 |
| 22 | 519.25 | 169.25 |
| 23 | 525.25 | 217.25 |
| 24 | 531.25 | 223.25 |
| 25 | 537.25 | 229.25 |
| 26 | 543.25 | 235.25 |
| 27 | 549.25 | 241.25 |
| 28 | 555.25 | 247.25 |
| 29 | 561.25 | 253.25 |
| 30 | 567.25 | 259.25 |
| 31 | 573.25 | 265.25 |
| 32 | 579.25 | 271.25 |
| 33 | 585.25 | 277.25 |
| 34 | 591.25 | 283.25 |
| 35 | 597.25 | 289.25 |
| 36 | 603.25 | 295.25 |
| 37 | 609.25 | 301.25 |
| 38 | 615.25 | 307.25 |
| 39 | 621.25 | 313.25 |
| 40 | 627.25 | 319.25 |
| 41 | 633.25 | 325.25 |
| 42 | 639.25 | 331.25 |
| 43 | 645.25 | 337.25 |
| 44 | 651.25 | 343.25 |
| 45 | 657.25 | 349.25 |
| 46 | 663.25 | 355.25 |
| 47 | 669.25 | 361.25 |
| 48 | 675.25 | 367.25 |
| 49 | 681.25 | 373.25 |
| 50 | 687.25 | 379.25 |

| CHANNEL | TV (MHz) | CATV (MHz) |
|---|---|---|
| 51 | 693.25 | 385.25 |
| 52 | 699.25 | 391.25 |
| 53 | 705.25 | 397.25 |
| 54 | 711.25 | 403.25 |
| 55 | 717.25 | 409.25 |
| 56 | 723.25 | 415.25 |
| 57 | 729.25 | 421.25 |
| 58 | 735.25 | 427.25 |
| 59 | 741.25 | 433.25 |
| 60 | 747.25 | 439.25 |
| 61 | 753.25 | 445.25 |
| 62 | 759.25 | 451.25 |
| 63 | 765.25 | 457.25 |
| 64 | 771.25 | 463.25 |
| 65 | 777.25 | 469.25 |
| 66 | 783.25 | 475.25 |
| 67 | 789.25 | 481.25 |
| 68 | 795.25 | 487.25 |
| 69 | 801.25 | 493.25 |
| 70 | | 499.25 |
| 71 | | 505.25 |
| 72 | | 511.25 |
| 73 | | 517.25 |
| 74 | | 523.25 |
| 75 | | 529.25 |
| 76 | | 535.25 |
| 77 | | 541.25 |
| 78 | | 547.25 |
| 79 | | 553.25 |
| 80 | | 559.25 |
| 81 | | 565.25 |
| 82 | | 571.25 |
| 83 | | 577.25 |
| 84 | | 583.25 |
| 85 | | 589.25 |
| 86 | | 595.25 |
| 87 | | 601.25 |
| 88 | | 607.25 |
| 89 | | 613.25 |
| 90 | | 619.25 |
| 91 | | 625.25 |
| 92 | | 631.25 |
| 93 | | 637.25 |
| 94 | | 643.25 |
| 95 | | 91.25 |
| 96 | | 97.25 |
| 97 | | 103.25 |
| 98 | | 109.25 |
| 99 | | 115.25 |
| 00 | | — |

| CHANNEL | TV (MHz) | CATV (MHz) |
|---|---|---|
| 100 | | 649.25 |
| 101 | | 655.25 |
| 102 | | 661.25 |
| 103 | | 667.25 |
| 104 | | 673.25 |
| 105 | | 679.25 |
| 106 | | 685.25 |
| 107 | | 691.25 |
| 108 | | 697.25 |
| 109 | | 703.25 |
| 110 | | 709.25 |
| 111 | | 715.25 |
| 112 | | 721.25 |
| 113 | | 727.25 |
| 114 | | 733.25 |
| 115 | | 739.25 |
| 116 | | 745.25 |
| 117 | | 751.25 |
| 118 | | 757.25 |
| 119 | | 763.25 |
| 120 | | 769.25 |
| 121 | | 775.25 |
| 122 | | 781.25 |
| 123 | | 787.25 |
| 124 | | 793.25 |
| 125 | | 799.25 |

RECEIVER HAVING A PRESET TUNER

BACKGROUND OF THE INVENTION

1. Field of the Invention

This invention relates generally to a receiver having a preset tuner and, more particularly, to a receiver which can automatically preset reception channels by searching for both terrestrial wave television broadcast channels and CATV broadcast channels according to their channel plans.

2. Description of the Prior Art

To conduct preset on a receiver of this kind capable of receiving both television broadcasts and CATV broadcasts, a user is required to decide if a terminal on the wall is for reception of television broadcasts or CATV broadcasts. According to such decision, the user then has to switch the receiver to a television broadcast or CATV broadcast side so that preset can be implemented. In this manner, the conventional receiver has been troublesome upon presetting and hence inconvenient for the user.

Accordingly, the present applicant has proposed an improved receiver of this kind in Japanese Patent Laid-open No. H7-87415 [H04N5/44, 7/16] laid open on Mar. 31, 1995. This art has solved a drawback to the need of manually switching the receiver and made it possible to automatically perform presetting for both television and CATV broadcast channels.

According to the proposed prior art, when reception is over a plurality of channels of a frequency band assigned only for CATV broadcast, preset must be conducted by automatically performing channel search according to a CATV broadcast channel plan. When reception is over one or less channel in a CATV frequency band, preset must be by automatically performing channel search according to a channel plan assigned for television broadcast.

The prior art described in Japanese Patent Laid-open No. 7-87415 provides automatic determination for receiving television broadcasts or CATV broadcasts. Suitable channel preset can be made in an automatic way without requiring user's decision or switching over on the receiver. Thus, this art is improved in usability excepting for a problem to be resolved. In the prior art, however, there is a possibility that a CATV broadcast even not to be received be determined as a CATV broadcast in an adjacent one of successive channels. This possibly result in erroneous setting as a television broadcast.

SUMMARY OF THE INVENTION

It is therefore a primary object of the present invention to provide a receiver capable of positively presetting CATV broadcast channels as well as television broadcast channels.

Another object of the invention is to provide a receiver capable of performing such preset in a brief time.

A receiver having a preset tuner according to the present invention is a receiver, having preset tuner for searching for channels of at least one of television broadcast and CATV broadcast and presetting data over a receivable channel onto a memory, comprising: a determination means for determining whether broadcast signals have been received over two or more of successive channels; and a preset means for presetting a reception channel according to a channel plan of at least one of television broadcast and CATV broadcast depending upon a result of determination by the determination means.

In one embodiment, the determination means includes a counter, an increment means for incrementing the counter when a reception signal is obtained over a set channel, a decrement means for decrementing the counter when no reception signal is obtained over the set channel, a count value determination means for determining whether a count value of the counter is a predetermined value or not.

The determination means includes a reception determination means for determining whether a reception signal is to be obtained over the set channel or not. The reception determination means includes a synchronization signal detecting means.

In television broadcasts, the channels in an adjacent relation are not utilized because of small P/S ratio. Accordingly, in actual frequency assignment, broadcast stations are not assigned to the channels in an adjacent relation but to the channels by skipping one channel or more without exception. Meanwhile, in CATV broadcast, the P/S ratio is taken great because of the necessity of packing many stations within a limited band range. Thus, in the CATV broadcast, broadcast stations are dotted throughout. The present invention has been made by considering on such a fact.

For example, a synchronizing signal is detected by a synchronizing signal detection circuit, a reception determining means at that time detects that a broadcast signal has been obtained over a set channel, for example, by a microcomputer. An increment means, in turn, increments a counter. However, if no broadcast signal exists over the set channel, the counter is decremented by a decrement means.

Consequently, where the microcomputer sets channels in an adjacent relation in order, if broadcast signals are detected over two or more successive (adjacent) channels, a number of "2" or greater is counted on the counter. In this case, the CATV channels are preset according to a CATV broadcast channel plan.

In television broadcast there is no case of practically using the channels in an adjacent relation because of small "Picture"/"Sound" ("P/S"). Consequently, the counter will not count a value of equal to or greater than "2". In this case, the preset means presets channels according to a television broadcast channel plan.

According to the invention, there is no necessity for a user to switch between television broadcast and CATV broadcast, similarly to the aforesaid reception technology, thus improving usability. Furthermore, in the invention, where a reception signal is successively detected over the adjacent channels, preset can be positively made for CATV broadcast.

The above described objects and other objects, features, aspects and advantages of the present invention will become more apparent from the following detailed description of the present invention when taken in conjunction with the accompanying drawings.

DETAILED DESCRIPTION OF THE PREFERRED EMBODIMENTS

Figure 1:
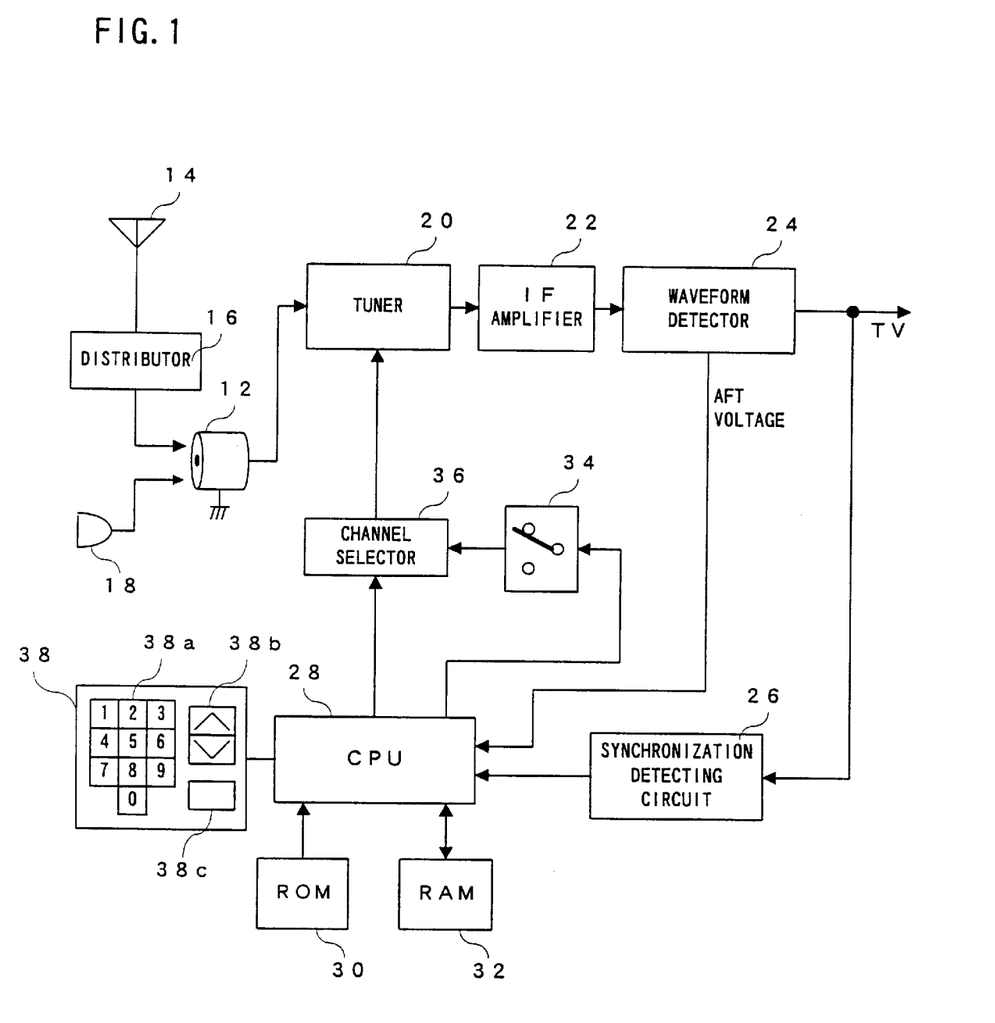
FIG. 1 is a block diagram showing a television receiver according to an embodiment of the present invention.
Figure 14:
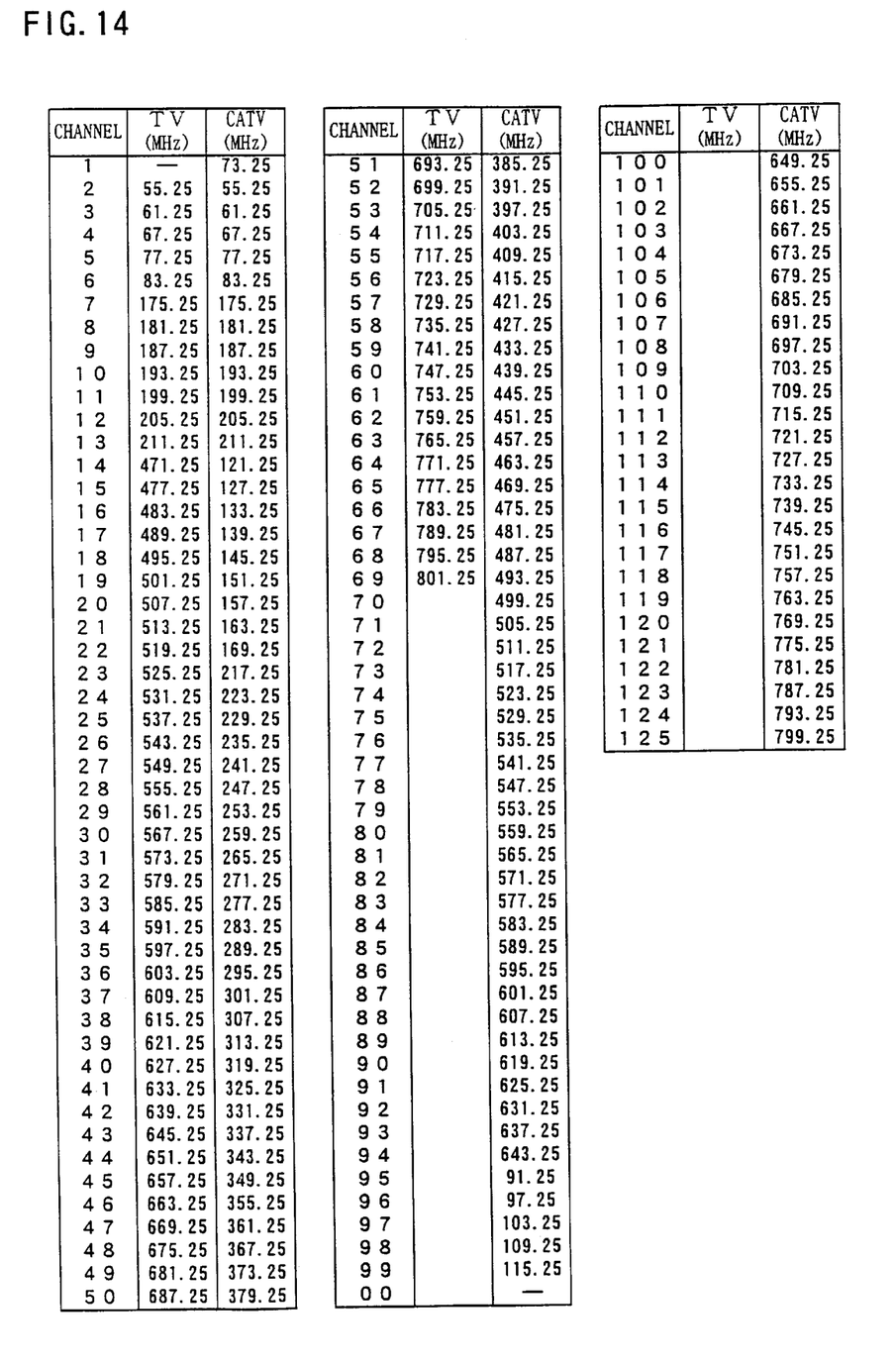
FIG. 14 is a table showing one example of actual television and CATV broadcast channel plans in the FIG. 1 embodiment.

A receiver 10 of an embodiment shown in FIG. 1 includes an input terminal 12. To this input terminal 12 is connected a television antenna 14 through a distributor 16 or a CATV cable terminal 18 directly. Consequently, the input terminal 12 is allowed to receive a television broadcast signal or CATV broadcast signal. Such a broadcast signal is delivered through the input terminal 12 to a tuner 20. The tuner 20 converts the received broadcast signal into an intermediate frequency signal, and outputs it to an IF amplifier 22. The intermediate frequency signal from the IF amplifier 22 is applied to a waveform detector 24 so that the detector 24 outputs a television signal. The television signal is supplied to a synchronization detecting circuit 26 where the synchronization detection circuit 26, upon detecting a synchronizing signal contained in the television signal, supplies a detection signal to a CPU 28. The CPU 28 cooperatives with a ROM 30 and RAM 32 to form a microcomputer or microprocessor capable of receiving an AFT (Automatic Fine Tuning) voltage sent from the waveform detector 24. Accordingly, the CPU 28 can determine, according to an AFT voltage, whether tuning has been established to a relevant channel for a television or CATV broadcast or not. Incidentally, the ROM constituting the microcomputer is previously written with a television or CATV broadcast channel plan as shown in FIG. 14. The RAM is to memorize a result of channel selection. The CPU 28, as will be concretely referred to later, controls a switch circuit 34 and channel selector 36 on the basis of a signal supplied from the synchronization detecting circuit 26, AFT voltage and information of ROM 30.

The switch circuit 34 switches to cause a channel selector 36 to switch a channel plan for between a television broadcast and a CATV broadcast. Furthermore, the channel selector 36 converts the control data sent from the CPU 28 into a tuning signal to be applied to a tuner 20 (to a local oscillation circuit thereof: not shown).

The CPU 28 is also connected with a keyboard 38. This keyboard 38 includes a ten key 38a for user to manually input a channel number, and an up/down key 38b and switch key 38c for the user to manipulate channel and/or volume control. The switch key 38c is to be manipulated by the user so that he or she can switch between a television broadcast and a CATV broadcast. For example, when a CATV broadcast is desired to view, the user may operate this switch key 38c. The CPU 28 in turn detects an operation on the switch key 38c, and switches the switch circuit 34 to a CATV broadcast side in accordance therewith. If the user operates the ten key 38a to input a channel number, the CPU 28 delivers frequency data concerning the channel number to the channel selector 36. Due to this, the channel selector 36 can apply a frequency signal in compliance with the frequency data to the tuner 20. Thus, it is possible for the user to view a CATV broadcast over a desired channel.

The preset operation in the FIG. 1 embodiment will now be explained with reference to FIG. 2 to FIG. 11 and FIG. 14. The CPU 28 in the first step S1 selects CATV broadcast channel 1. That is, CPU 28 switches the switch circuit 34 to CATV, and outputs CATV•1CH frequency data to the channel selector 36. The channel selector 36, in turn outputs a frequency control signal (tuning signal) for CATV•1CH. Consequently, the tuner 20 is tuned to CATV•1CH. In the next step S2, the CPU 28 sets an initial value "1" of a variable N to a variable register (not shown) formed in a proper area of the RAM 32.

Figure 2:
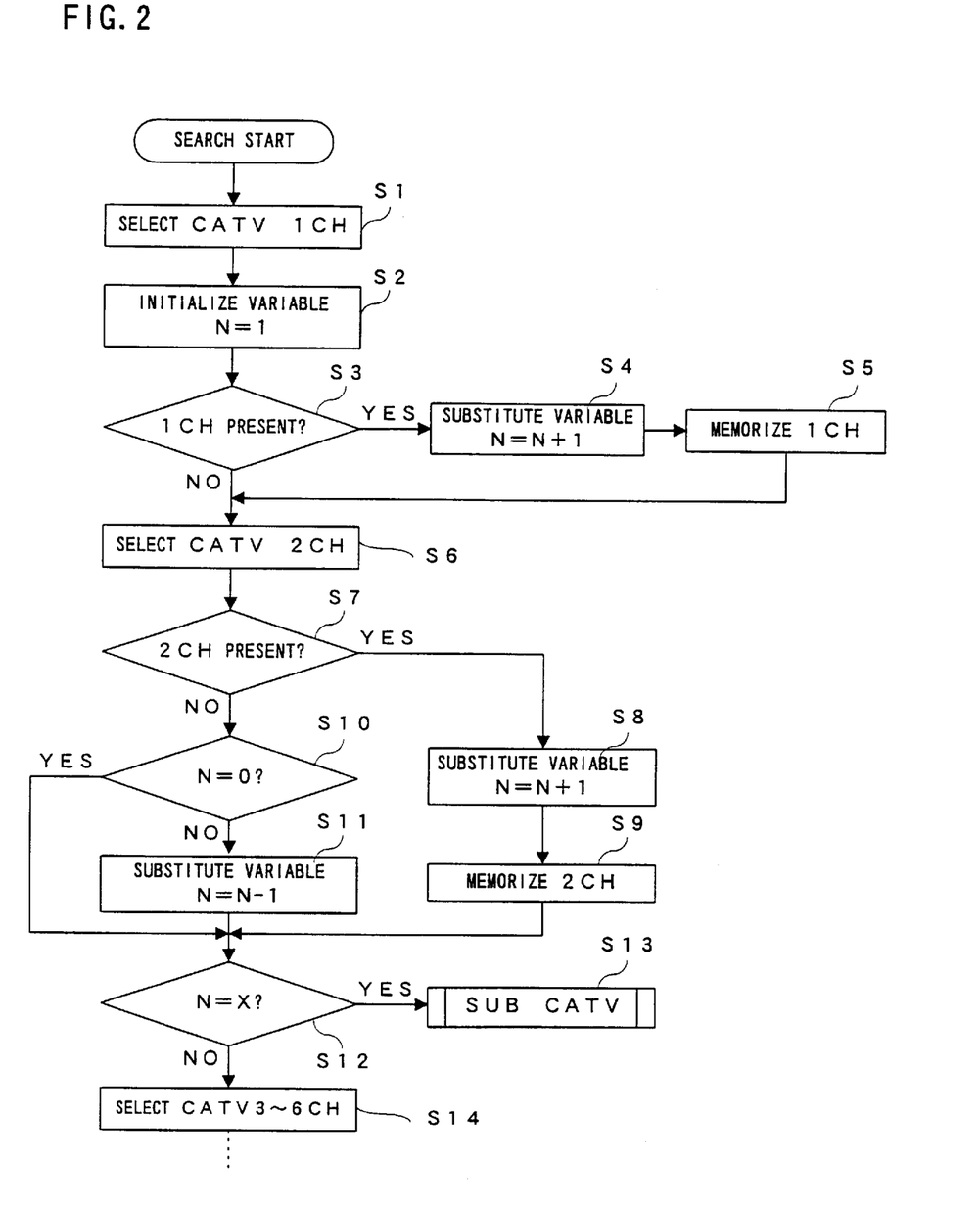
FIG. 2 is a flowchart showing preset operation in the FIG. 1 embodiment.

In step S3, the CPU 28 then determines whether there is a broadcast signal over CATV•1CH based on a synchronization detecting signal sent from the synchronization detecting circuit 26. Because the existence of a broadcast signal is determined depending upon whether a synchronizing signal has been detected or not, it is possible to greatly improve the processing speed as compared to the case of determining a reception level after operating an AFT.

In order to detect a reception channel by only the presence or absence of a synchronizing signal, it is desired to previously search for all the television and CATV broadcast channels prior to implementing a preset operation so that the channels over which SD signals have been obtained by the waveform detector 24 can be previously registered in the memory 32. By doing so, it is possible to rapidly determine whether or not a broadcast signal has been received during presetting by using only a synchronizing signal.

If "YES" is determined in step S3, the CPU 28 in the next step S4 increments a value of the variable register, i.e. sets to "N+1", and them in step S5 stores the presence of CATV•1CH to the RAM 32.

If "NO" is determined in the step S3, the CPU 28 in step S6 provides frequency data to the channel selector 36 and controls it to select CATV•2CH.

Then, the CPU 28 in step S7 detects the existence of a broadcast signal over CATV•2CH, similarly to the step S3. If a broadcast signal over CATV•2CH is detected in step S7, the CPU 28 in step S8 sets a variable to "N+1", and in step S9 memorizes the signal reception over CATV•2CH to the RAM 32.

If "NO" is determined in step S7, the CPU 28 in step S10 checks the variable register (not shown) within the RAM 32 to determine whether the variable N is "0" or not. Here, the variable N represents the number of channels over which receptions have been consecutively done in CATV broadcast, wherein N=0 means that no reception has been made over CATV•1CH. Also, if the variable N is not "0", the CPU 28 in step S11 decrements the variable N of the variable register, i.e., sets it to "N=N−1".

Thereafter, when "YES" is determined in step S10 or step S11 has been executed or the process of step S9 has been completed, the CPU 28 in step S12 determines whether the variable is a predetermined number X or not. If "N=X" is determined in the step S12, i.e. when the number of reception channels in CATV broadcast has reached a predetermined number, then in step S13 a subroutine of a CATV process, to be explained in detail later, is entered. Note that the predetermined number X uses a proper numeral, such as "2" or "3".

If it is determined in step S12 that the variable N=X is not met, then in step S14 the CPU 28 selects CATV broadcast channels 3 to 6 (CATV•3CH–CATV•6CH), similarly to CATV•2CH as mentioned before. That is, in step S12 the steps S6–S11 are repeated on each CATV channel basis.

Figure 3:
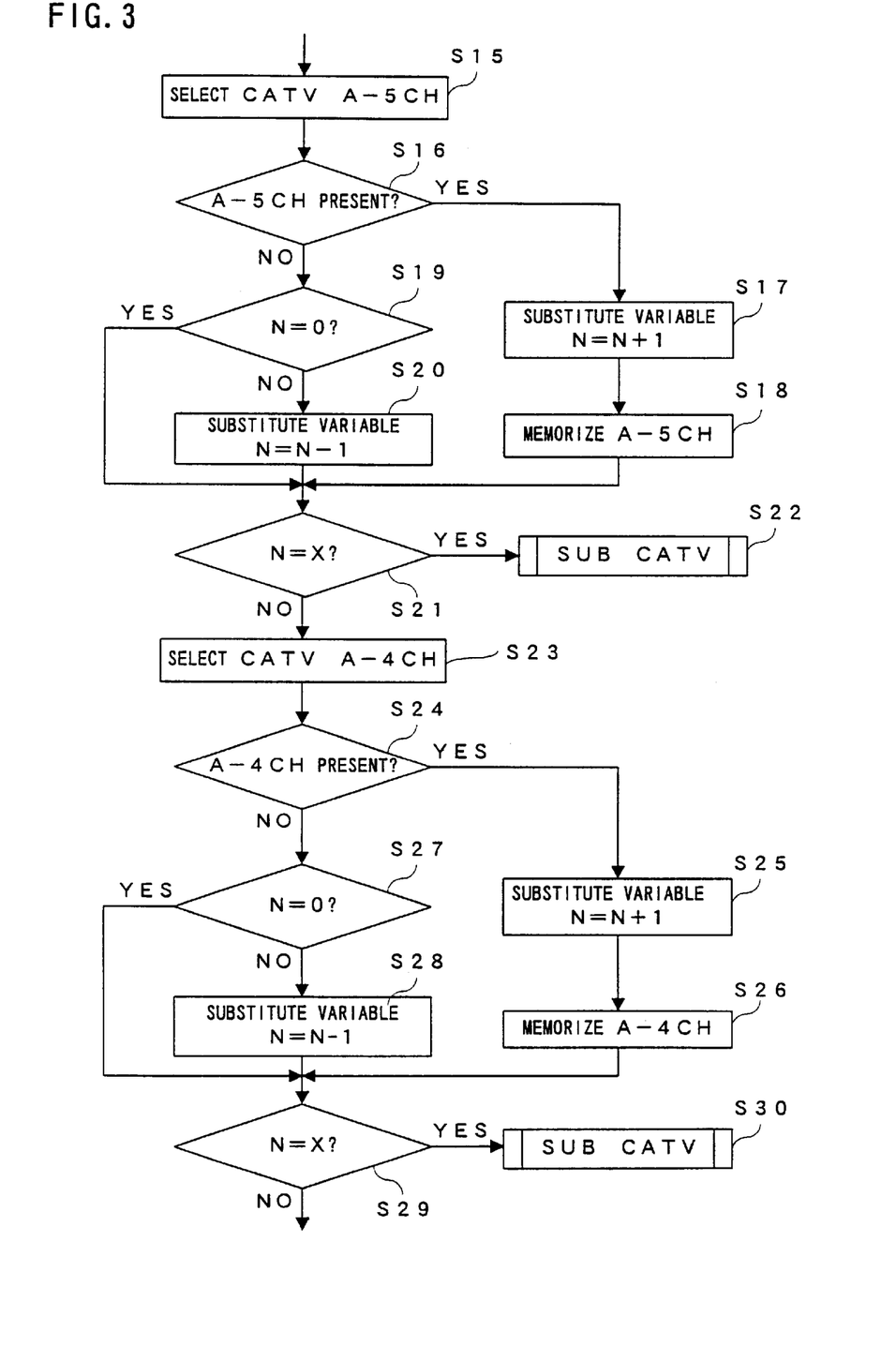
FIG. 3 is a flowchart showing preset operation continuing from FIG. 2 in the FIG. 1 embodiment.

Thereafter, steps S15–S22 are executed to select CATV•A-5CH. It is determined in step S18 whether a reception signal (synchronizing signal) exits over CATV•A-5CH or not. If exists, in the steps S17 and S20 the variable N is incremented and a relevant channel A-5 is written onto the RAM 32, and then the process advances to the step S21. If no signal exists, it is determined in the step S19 whether the variable N is "0" or not. If N≠0, then in step S22 the variable N is decremented and then the process proceeds to step S21. However, if N=0, the step S21 is executed directly. In the step S21 it is determined whether the variable N is a predetermined value "X" or not similarly to the former step S12, similarly to the former step S12. If "YES" is determined in this step S21, it is considered that receptions are possible over a predetermined number or more of successive channels in CATV broadcast. Accordingly, a CATV subroutine (to be referred later) of step S22 is executed.

Figure 4:
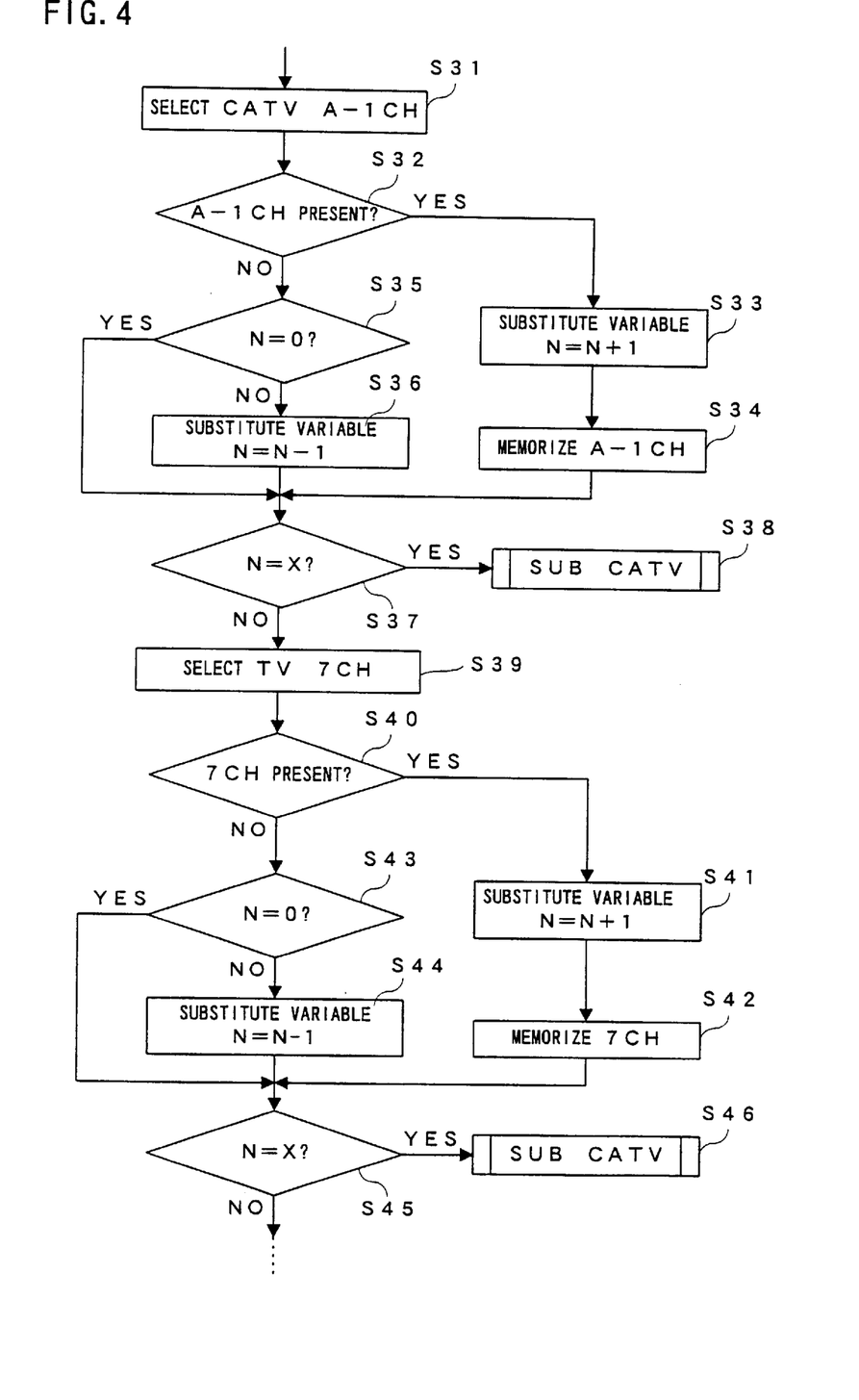
FIG. 4 is a flowchart showing preset operation continuing from FIG. 3 in the FIG. 1 embodiment.

Similarly, the processes of step S23 to step S30 are executed to confirm reception over CATV•A-4CH, and the processes of the step S31 to step S38 are executed to confirm receptions over CATV•A-1CH.

In the case that the variable N, i.e. the number of CATV channels over which receptions have been consecutively done, is a predetermined value X in the step S29 or S37, then a CATV subroutine is executed in the step S30 or S38.

Figure 5:
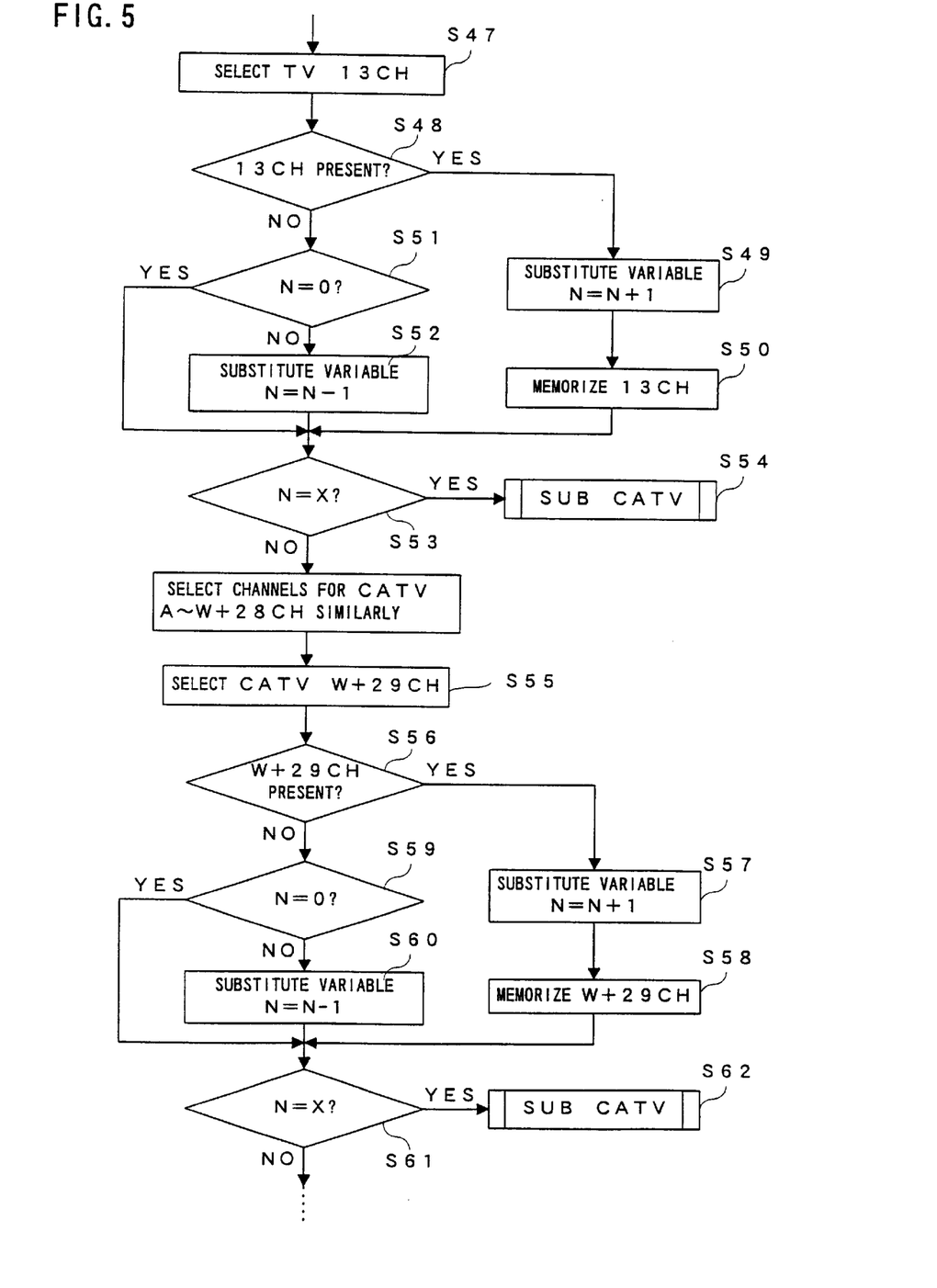
FIG. 5 is a flowchart showing preset operation continuing from FIG. 4 in the FIG. 1 embodiment.
Figure 6:
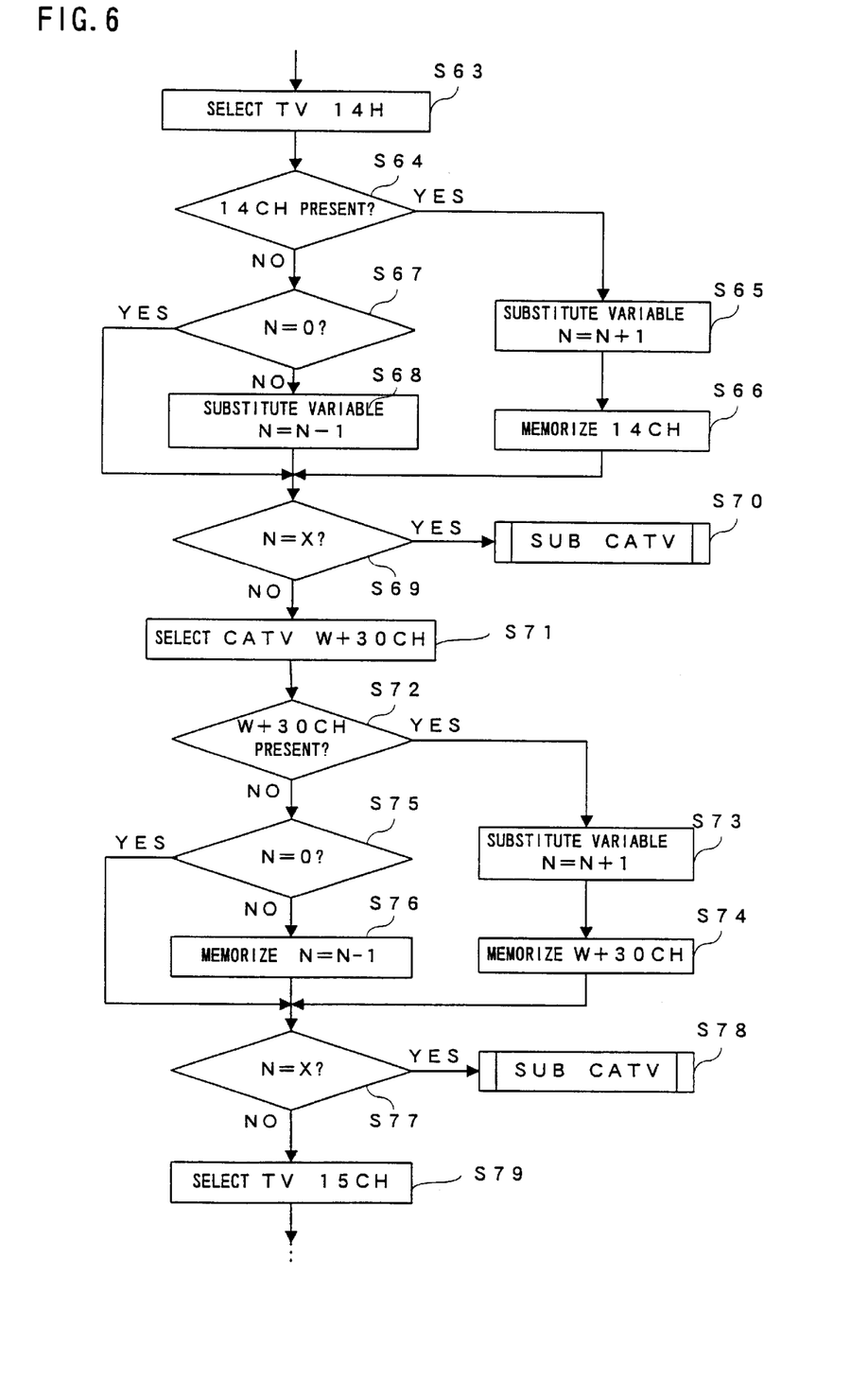
FIG. 6 is a flowchart showing preset operation continuing from FIG. 5 in the FIG. 1 embodiment.
Figure 7:
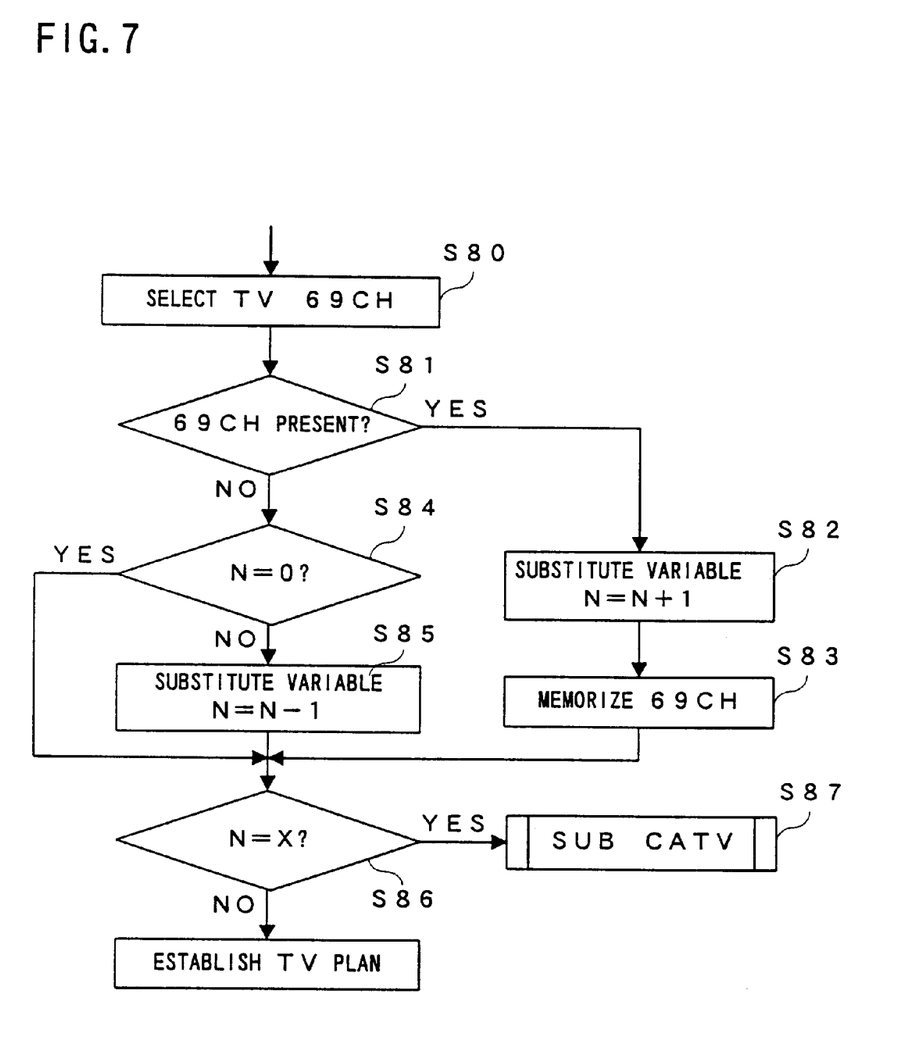
FIG. 7 is a flowchart showing preset operation continuing from FIG. 6 in the FIG. 1 embodiment.

If variable N≠X is determined in step S37, the CPU 28 executes the following steps S39 to S54 to confirm receptions of television broadcasts over TV•7CH–13CH.

Furthermore, receptions over CATV•ACH-CATV•W+28CH are confirmed, and receptions over CATV•W+29CH are confirmed in steps S55 to S62. Thereafter, confirmation is made for a reception over a television channel 14 CATV•W+29CH. Thereafter, confirmation is made for reception of television channel 14 in steps S63 to S70, and confirmation is made for a reception over CATV•W+30CH in steps S71–S78. Then, receptions over TV•15CH–68CH are confirmed in step S79 and the subsequent. Finally, the processes of steps S80–S87 are executed to confirm reception of TV•69CH. If N≠0 is confirmed in step S86, then it eventually means that receptions could not have been made over a predetermined number X or more of successive channels in CATV broadcast. In other words, it means that the input terminal 12 of FIG. 1 is being connected to the antenna 14. Accordingly, in that stage the CPU 28 conducts a preset according to a channel plan for television broadcast channels.

Figure 8:
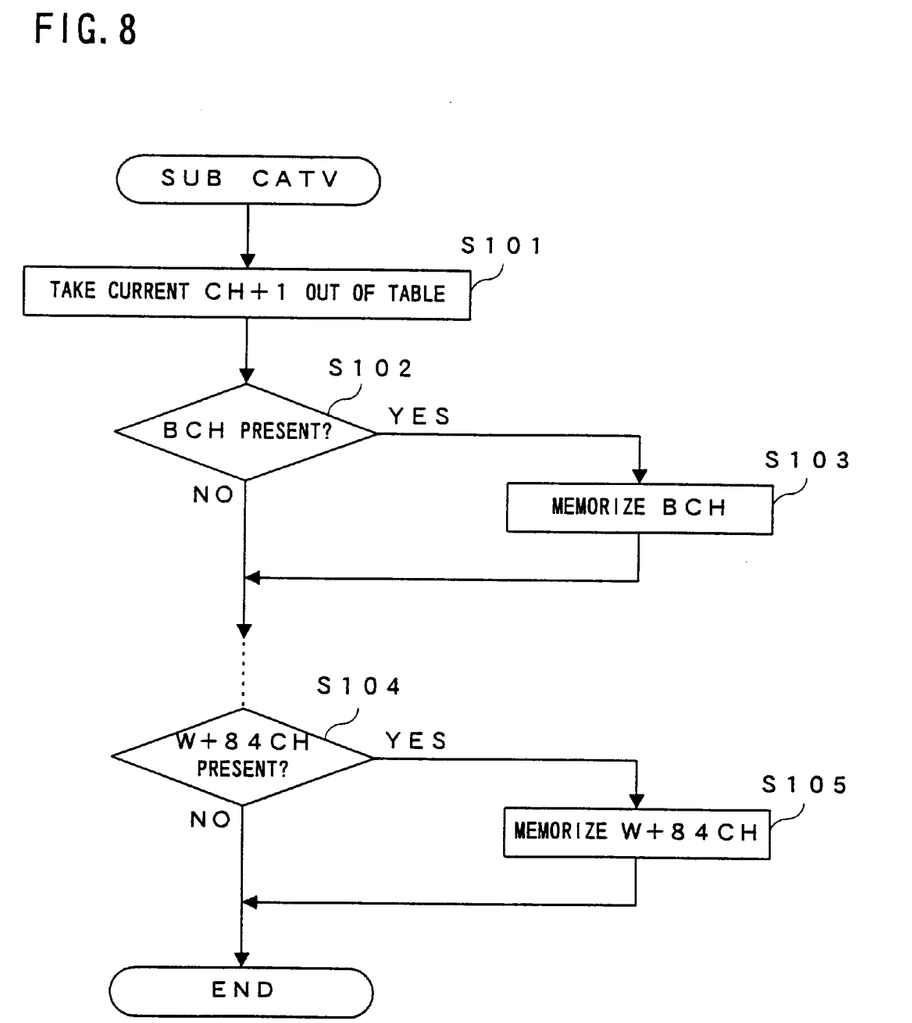
FIG. 8 is a flowchart showing a CATV subroutine in the FIG. 1 embodiment.

Incidentally, in the CATV subroutine shown concretely in FIG. 8, the CPU 28 in the first step S101 provides a setting for a channel higher by one than the channel being set at that time, i.e. "current channel+1". It is then determined in step 102 whether reception has been done over CATV•BCH or not, depending on the presence or absence of a synchronizing signal sent from the synchronization detecting circuit 26 (FIG. 1). If reception can be made over CATV•BCH, the same CATV•BCH is memorized in the RAM 32 in step S103. If no reception can be made over CATV•BCH, the process advances to the next step, and finally the CPU 28 in step S104 determines whether reception can be made over CATV•W+84CH or not. If reception can be done over the channel W+84, the same channel is memorized in the RAM 32 in step S105. In this manner, it is possible to implement CATV channels presetting according to the CATV broadcast channel plan.

Figure 10:
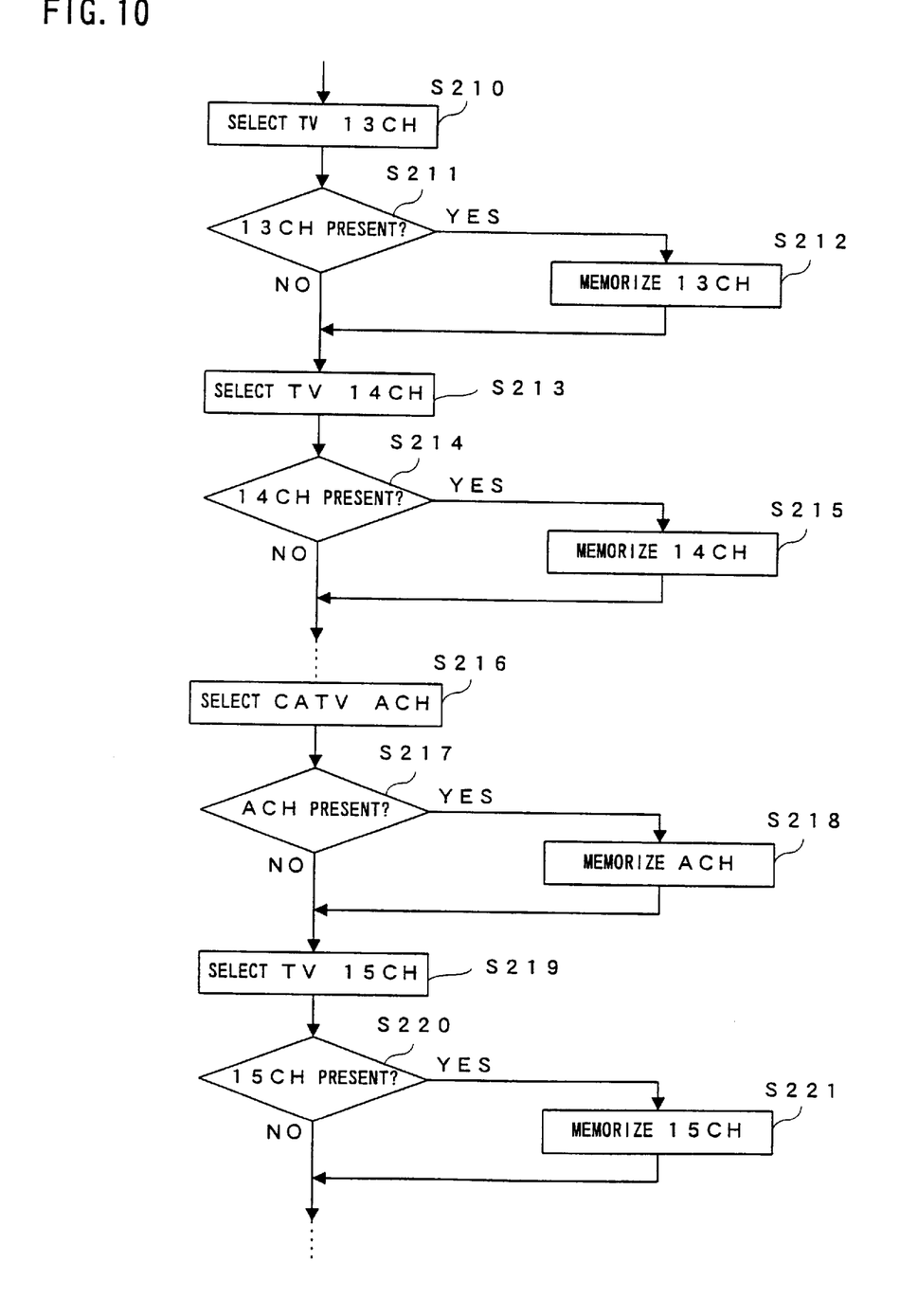
FIG. 10 is a flowchart showing search operation continuing from FIG. 9 in the FIG. 1 embodiment.
Figure 11:
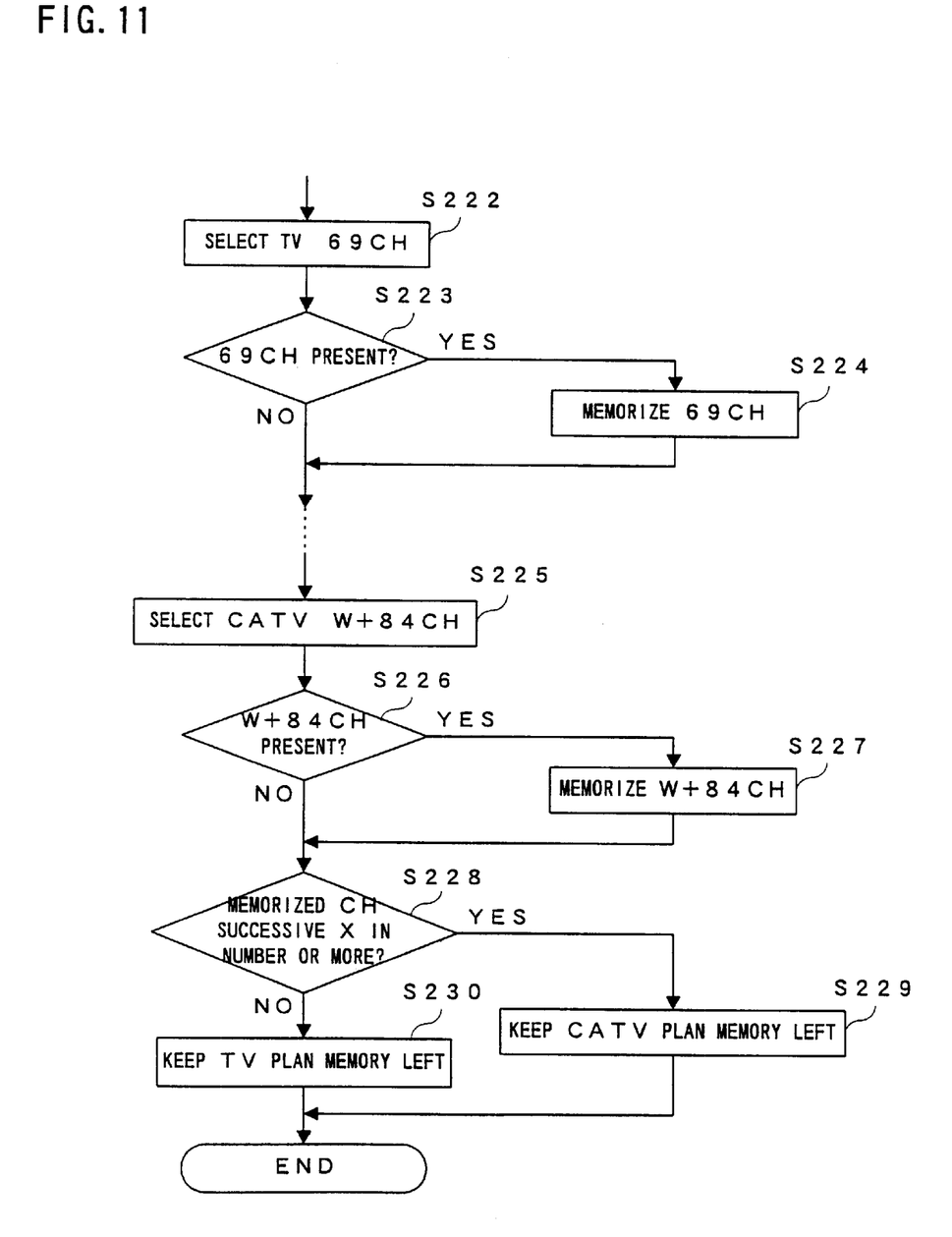
FIG. 11 is a flowchart showing search operation continuing from FIG. 10 in the FIG. 1 embodiment.

Next, explanation will be made on searching with using the receiver 10 having been preset for television or CATV broadcast channels by executing the preset operations of FIG. 2 to FIG. 8 in the FIG. 1 embodiment, with reference to FIG. 9 to FIG. 11.

Figure 9:
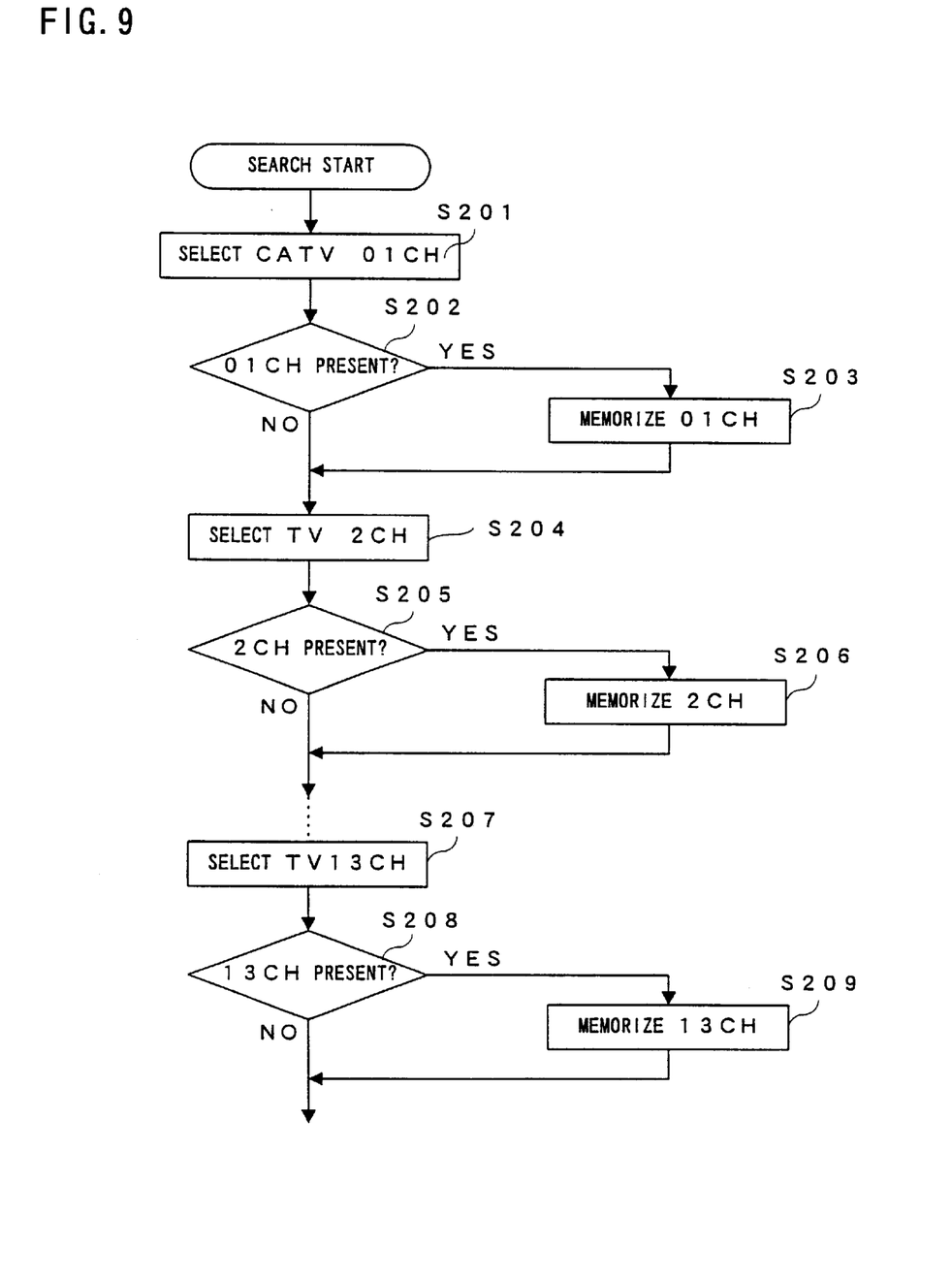
FIG. 9 is a flowchart showing search operation in the FIG. 1 embodiment.

In the first step S201 of FIG. 9, setting is made to CATV•1CH. It is determined in step S202 whether reception is possible over CATV•1CH or not. If "YES" is determined, the CPU 28 in the next step S203 memorizes the reception of over CATV•1CH to the RAM 32.

Similarly, confirmation is made in steps S204–S206 on reception of TV•2CH. After these steps, receptions are confirmed over TV•3CH, TV•4CH and TV•12CH in the order until reception over TV•13CH is confirmed in steps S207–S209. Thereafter, confirmations are respectively made for receptions over TV•13CH in steps S210–S212 and TV•14CH in steps S213–S215.

After confirming reception of CATV•ACH in steps S216–S218, confirmations are respectively made for receptions over TV•16CH, TV•18CH, . . . TV•69CH in steps S219–S226. Thereafter, receptions over CATV•W+1CH, CATV•W+2CH, . . . CATV•W+83CH are respectively confirmed until reception over CATV•W+84CH is confirmed by steps S225–S227.

Finally, the CPU 28 in step S230 makes reference to the channels memorized on the RAM 32 and determines whether a predetermined number or more of successive channels have been received or not. If "YES" here, then it means that preset has been implemented according to the CATV broadcast channel plan. Consequently, in step S229 the CPU 28 keeps the preset data due to the CATV channel plan in the RAM 32. If "NO" is determined in step S228, it means that preset has been made according to the television broadcast channel plan. The CPU 28 stores the preset data due to the television channel plan in the RAM 32.

Next, explanation will be made on the actual receiving operation of the television receiver 10 having been completed of preset as above, with reference to FIG. 12 or FIG. 13.

Figure 12:
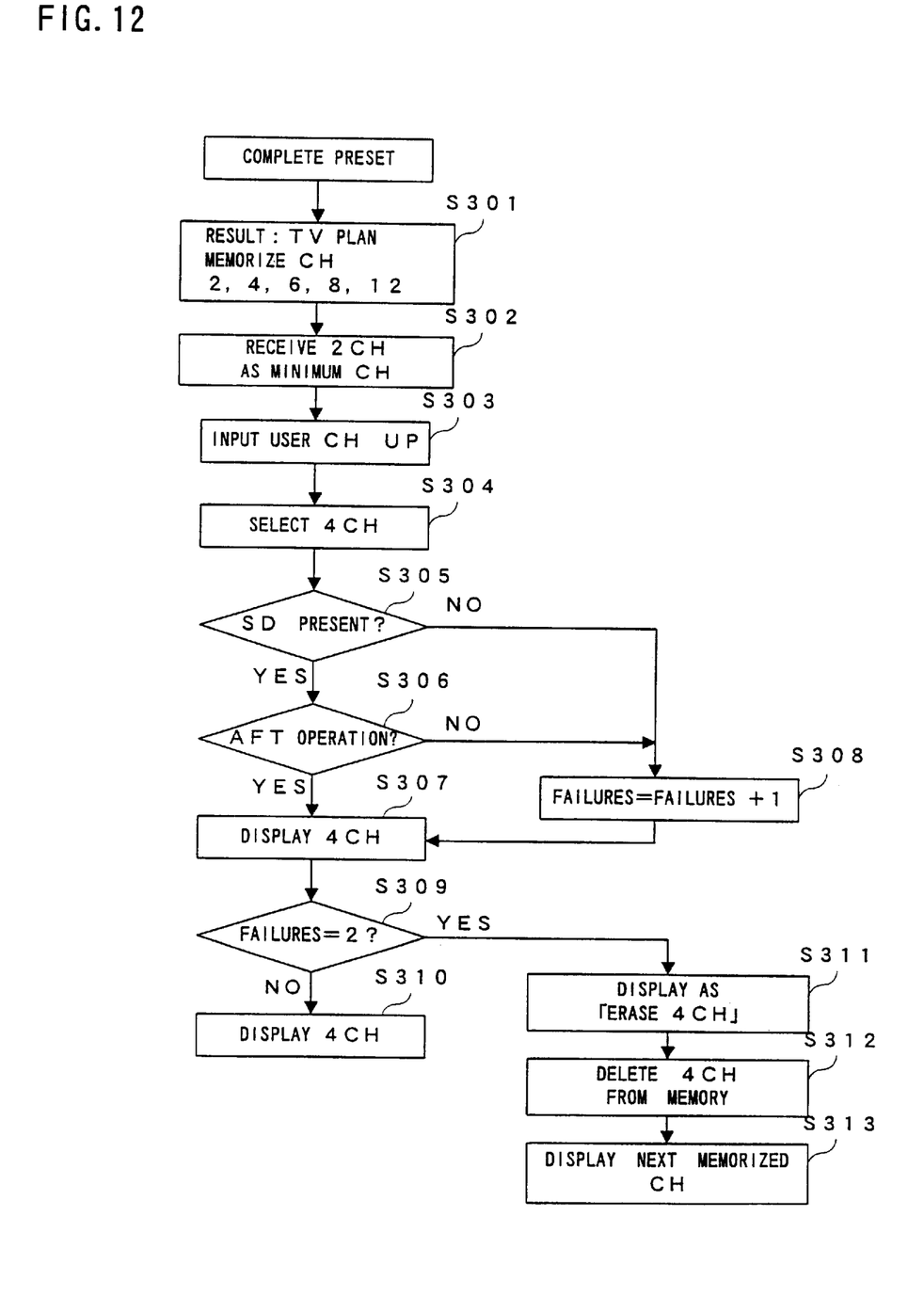
FIG. 12 is a flowchart showing one example of channel selecting operation during actual use in the FIG. 1 embodiment.

In an example of FIG. 12, it is confirmed in step S301 that preset has been made for TV•2CH, 4CH, 6CH, 8CH and 12CH according to the television broadcast channel plan. In step S302 the CPU 28 controls the switch circuit 34 and the channel selector 36 to receive a receivable channel, i.e. a channel with a minimum numbered preset channel, or TV•2CH in this example.

Thereafter, if the user in step S303 manipulates the up/down key 38b (FIG. 1) to shift up the channel, the CPU 28 in step S304 controls the channel selector 36 to select a next channel of TV•4CH.

Thereafter, the CPU 28 determines in step S304 whether an AFT voltage, i.e. SD signal, has been inputted from the waveform detector 24 or not. If "YES", AFT operation is executed in the next step S306 and display over TV•4CH is made in step S307.

If "NO" is determined in step S305 or S306, the CPU 28 in step S308 determines that reception over TV•4CH was failed and accordingly increments a count value of a failure counter (although not shown, this may be formed, e.g., in a proper area on the RAM 32). If this is a first failure, the number of failures is "1". In step S309 the CPU 28 makes reference to the failure counter (not shown) and determines whether the number of failures reaches "2" or not. If the number of failures is not equal 2, display over TV•4CH is made in step S310.

If the number of failures is "2", then the CPU 28 in step S311 provides on-screen display on a message "ERASE 4CH" on a display screen of the television receiver, and then in step S312 deletes the TV•4CH preset data from a predetermined area of the RAM 32. Subsequently, in step S313 display over a next TV channel is made according to user's operation of the up/down key 38*b*.

According to this embodiment, where actual reception cannot be made over a channel having been set as a receivable channel in the memory by presetting, the same channel is erased from the memory upon actual use. It is therefore possible for the user to omit labor and time in erasure. Moreover, erroneous setting can be automatically corrected.

Figure 13:
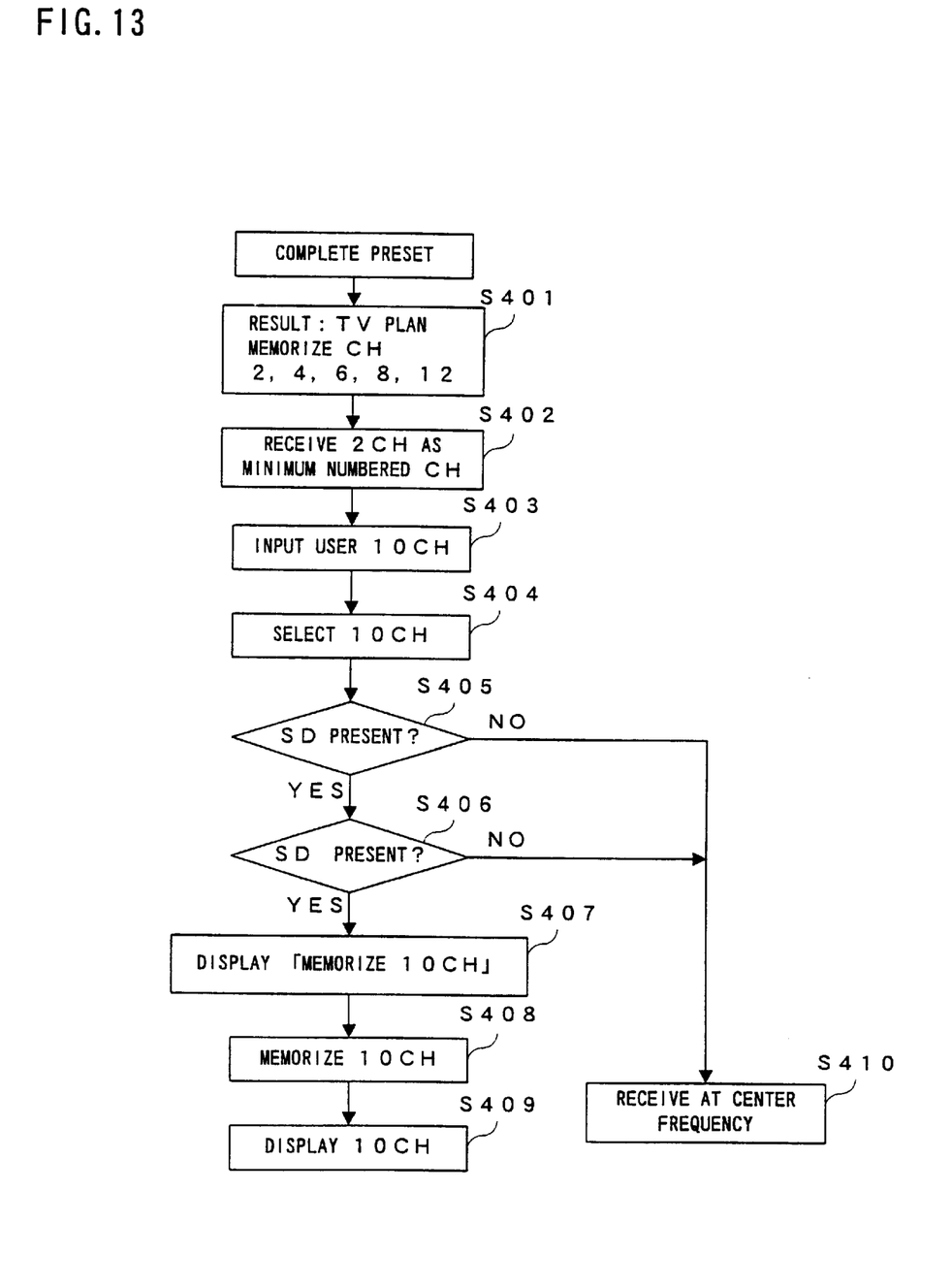
FIG. 13 is a flowchart showing another embodiment of channel selecting operation during actual use in the FIG. 1 embodiment.

In an example of FIG. 13, it is confirmed in step S401 that preset has been done for TV•2CH, 4CH, 6CH,. 8CH and 12CH according to the television broadcast channel plan. In step S402, the CPU 28 controls the switch circuit 34 and channel selector 36 to receive a minimum numbered preset channel, i.e. TV•2CH in this example.

Thereafter, if the user in step S403 manipulates the ten key 38*a* (FIG. 1) to make setting for TV•4CH, the CPU 28 in the next step S404 controls the channel selector 36 to select a channel TV•4CH.

Thereafter, the CPU 28 in step S405 determines whether an SD signal has been inputted from the waveform detector 24 or not. If "YES", it is determined in the next step S406 whether another SD signal has been inputted or not. In step S407, display over TV•4CH is performed.

If "YES" is determined in both the steps S405 and S406, it means that reception is possible over TV•10CH having not been preset. In this case, the CPU 28 in the next step S407 performs on-screen display of a message "MEMORIZE 10CH" on the display screen of the television receiver, and then in step S408 memorizes data over TV•10CH to a predetermined area of the RAM 32. Subsequently, display over TV•10CH is performed in step S409.

If "NO" is determined in step S405 or S406, the CPU 28 in step S410 performs reception at a center frequency.

In this manner, according to the present embodiment, if, during actual use, reception is possible over other channel than the channels having been memorized as receivable channels in the memory by implementing presetting, the data over the same channel will be automatically added to the memory during that usage. It is therefore possible for the user to omit labor and time in adding such data. Moreover, erroneous setting can be automatically corrected.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A receiver, having a preset tuner for searching for channels of at least one of television broadcast and one of CATV broadcast and presetting data over a receivable channel onto a memory, comprising:

a determination means for determining whether broadcast signals have been received over two or more successive channels; and a preset means for presetting a reception channel according to a channel plan of CATV broadcast if it is determined that the broadcast signals can be received over two of more successive channels by said determination means, wherein said determination means includes a counter, an increment means for incrementing said counter when a reception signal is obtained over a set channel, a decrement means for decrementing said counter said counter when no reception signal is obtained over said set channel, a count value determination means for determining whether a count value of said counter is a predetermined value or not.

2. A receiver according to claim 1, wherein said determination means includes a reception determination means for determining whether a reception signal is to be obtained over said set channel or not.

3. A receiver according to claim 2, wherein said reception determination means includes a synchronization signal detecting means.

* * * * *